United States Patent [19]

Short et al.

[11] Patent Number: 4,851,078
[45] Date of Patent: Jul. 25, 1989

[54] DIELECTRIC ISOLATION PROCESS USING DOUBLE WAFER BONDING

[75] Inventors: John P. Short, Indian Harbour Beach; George V. Rouse, Melbourne, both of Fla.

[73] Assignee: Harris Corporation, Melbourne, Fla.

[21] Appl. No.: 67,838

[22] Filed: Jun. 29, 1987

[51] Int. Cl.[4] .................... H01L 21/20; H01L 21/302
[52] U.S. Cl. .................... 156/632; 156/645; 156/648; 437/62; 437/84; 437/225
[58] Field of Search ............... 156/630, 631, 632, 648, 156/662, 645; 437/62, 67, 84, 946, 225, 249

[56] References Cited

U.S. PATENT DOCUMENTS 4,501,060  2/1985  Frye et al. ........................ 437/62
4,601,779  7/1986  Abernathey et al. ............. 156/628

Primary Examiner—David L. Lacey
Assistant Examiner—Andrew J. Anderson
Attorney, Agent, or Firm—William A. Troner; Charles C. Krawczyk

[57] ABSTRACT

A method of forming a high quality dielectrically isolated silicon on insulator semiconductor device using a double wafer bonding process. As a result of the double wafer bonding process, the invention significantly reduces the device limitations presently known with dielectric isolation and silicon on insulator structures. The present invention specifically eliminates the need for grinding or polishing the final surface which the devices will be implemented in, thereby eliminating the adverse effects which these mechanical processes impute onto these surfaces. Additionally, the present invention eliminates the need for a thick polycrystalline deposition for the production of the dielectric isolation, thereby eliminating the adverse effects of single crystal bulk defects and the loss of tolerance control due to warpage which would otherwise occur in a dielectric isolated process. Also as a result of the double bonding process, tighter tolerances and more precisely positioned final islands are achieved, thereby allowing for more densely packed or smaller circuits for a given application.

21 Claims, 7 Drawing Sheets

DIELECTRIC ISOLATION PROCESS USING DOUBLE WAFER BONDING

FIELD OF THE INVENTION

The present invention relates generally to a method of producing semiconductor wafers, and more specifically, to a method of forming dielectrically isolated silicon on insulator semiconductors.

BACKGROUND OF THE INVENTION

Dielectrically isolated integrated circuits (DI) have long been fabricated in a series of chemical and mechanical process steps resulting in single crystal silicon islands or tubs. These islands or tubs are surrounded on the sides and bottom by a dielectric material such as silicon dioxide and further contained in a matrix of polycrystalline silicon, as illustrated in FIG. 10. The process steps of forming a DI structure is highlighted by anisotropically etching grooves or moats into a polished slice of single crystal silicon, oxidizing the resulting surface, depositing polycrystalline silicon on the surface to a depth dictated by that needed for the final DI slice thickness, then grinding and polishing the original substrate away until the oxidized moat bottoms are exposed and the final required isolated island depth is reached.

The thick polycrystalline deposition step is, however, a primary limiter of the quality and utility of the final DI structure. This is a result of both the thickness and the high temperature deposition required for depositing the polycrystalline material. The high temperature deposition induces warpage on the device surface such that the warpage adversely affects the subsequent mechanical grind and polishing steps, resulting in adversely affecting the final island depth, size and spacing tolerances. This deposition also induces damaging stress into the final islands, resulting in eventual device leakage. This stress is sufficient enough such that the single crystal actually "shrinks", causing the final islands to be out of position relative to their original masked location. This can further lead to mismatching with subsequent processing masks in the integrated circuit fabrication.

One method of compensating for the potential of varying depth, size, spacing and mismatching of the islands, is to purposefully increase the size and depth of the islands. This increase in size and depth, however, unnecessarily increases the surface area of the islands, and therefore, adversely affects the density on the chip.

The final grind and polishing steps on the surface of the semiconductor structure can also cause deleterious effects on the final semiconductor devices. In addition to the thickness variation inherent with any grinding and polishing step, varying amounts of surface damage will also necessarily result from the grinding of the surface. Although the polishing will remove most of the damage of the surface caused by the grinding, it will not remove all the damage imputed onto the surface. Additionally, residual damage can result from the polish. While a "chemical" silicate gel polish is generally used as the finish, this part of the polish must be minimized or severe "stand up" of the oxide coming to the surface will occur. The breaking off of the dielectric oxide during the final stages of polish can also cause some additional damage on the silicon surface. This surface damage results in the significant decrease in the quality of the devices later formed in the structure.

Another method being pursued for achieving isolation between devices is found in the silicon on insulation (SOI) art. By providing a thin layer of insulation between the substrate and the device forming layer, better isolation can be obtained for the devices formed in the semiconductor structure. This results in increasing speed, decreasing power, and improving transient radiation hardness of the semiconductor devices.

One technique for producing the thin SOI semiconductor structure involves subsurface implanted oxygen followed by an epitaxial or device forming layer grown on the silicon substrate. The implanted oxygen is annealed prior to providing the epitaxial layer so that the portion of silicon above the buried oxide becomes acceptable quality single-crystal silicon. The semiconductor devices are formed in the epitaxial layer with the underlying buried oxide providing isolation between the epitaxial layer and the substrate. This method commonly referred to as SIMOX (separation by implanted oxygen) has limitations, however, in the crystal quality of the semiconductor material over the buried oxide. This is due to the effect of bombarding the surface of the semiconductor during implantation. The bombardment adversely affects the crystallization of the semiconductor surface.

An alternative method for forming silicon on insulator structures has evolved in which wafers are bonded together with one of the wafers subsequently being partially removed. An example of this method is disclosed in an article by Brock, et al, "Fushing of Silicon Wafers", IBM Technical Disclosure Bulletin, Vol. 19, No. 9, Feb. 1977, pps. 3405-3406, in which it is stated that "wafers may be fused together conveniently by forming a layer of silicon dioxide on each wafer, then placing the layers of silicon dioxide abutting each other, and heating, preferably in a steamed atmosphere at a temperature in the order of 1050° C. for about one-half hour." One of the wafers is then partially removed, leaving behind a thin layer on the remaining wafer with an oxide therebetween. The resulting SOI wafer can then be made fully dielectrically isolated with sidewall isolation, by etching grooves to the buried oxide and then filling these grovoes with polycrystalline silicon.

The removal of the original substrate in this SOI process, however, involves grinding and polishing the semiconductor surface. This results in similar adverse effects that the grinding and polishing cause in the formation of the previously discussed DI structure.

SUMMARY OF THE INVENTION

It is thus an object of the present invention to provide a new and improved method of producing a high-quality dielectrically isolated semiconductor structure.

It is another object of the present invention to provide a new and improved method of producing a semiconductor structure which avoids the need to grind and polish the surface of the device forming layer, thereby avoiding the potential surface damage which would otherwise result.

It is still another object of the present invention to provide a new and improved method of producing a dielectrically isolated semiconductor structure which does not require a thick polycrystalline silicon deposition, thereby avoiding the single crystal bulk defects, pattern shrinkage, and loss of tolerance control which are attributed to a thick polycrystalline deposition.

It is further an object of the prsent invention to provide a new and improved method of producing a combined dielectrically isolated-silicon on insulator semiconductor structure having reduced thickness variation.

It is still further an object of the present invention to provide a new and improved method of producing a combined dielectrically isolated silicon on insulator semiconductor structure having thinner islands with closer thickness tolerances.

It is another object of the present invention to provide a dielectrically isolated semiconductor structure having smaller islands which result from the use of a reactive ion etcher in forming the moat area and thus eliminates the need for corner compensation.

These and other objects of the present invention are attained by providing a method of forming a semiconductor device incorporating the advantages of a dielectrically isolated and a silicon on insulator structure. In accordance with the preferred embodiment of the invention, the method for producing the structure includes initially forming an epitaxial layer on a heavily doped substrate followed by bonding an oxidized handle wafer to the epitaxial layer. The original substrate is then ground, etched and polished away, resulting in a standard silicon on insulator (SOI) type structure. A second oxidized handle wafer is then bonded to the now exposed surface of the epitaxial layer followed by the removal of the first handle wafer. This results in a structure by which the newly exposed surface of the epitaxial layer has neither been ground or polished mechanically, thereby avoiding the resulting damage to the surface. Tubs or moats are etched in the epitaxial layer followed by the oxidation of the exposed surfaces of the tubs which were formed by the etching process. A thin layer of polycrystalline silicon is then grown filling the moats followed by a polishing step or plasma etch to planarize the polycrystalline layer with the epitaxial layer.

By combining the DI and SOI processing techniques using a double bonding method, the present invention significantly reduces the limitations of the existing DI and SOI semiconductor processes. With respect to the standard dielectric isolated structures, the invention eliminates the thick polycrystalline deposition altogether from the process, thereby eliminating the adverse effects from the high temperature deposition required for the thick polycrystalline layer, notably single crystal bulk defects, pattern shrinkage and loss of tolerance control due to warpage. With respect to both DI and SOI processes, the present invention eliminates the need for grinding or polishing the epitaxial surface where the devices are to be formed, thereby eliminating the probability of surface damge from these steps, as well as the thickness variation which they contribute. The tighter tolerances of the present invention, as well as the more precisely positioned final islands, also allow for a more densely packed or smaller circuits for a given application.

Further objects, features, and advantages of the present invention will become more apparent from the following description when taken with the accompanying drawings which show, for purposes of illustration only, an embodiment in accordance with the present invention.

BRIEF DESCRIPTIONS OF THE DRAWINGS

DETAILED DESCRIPTION OF THE DRAWINGS

Figure 1:
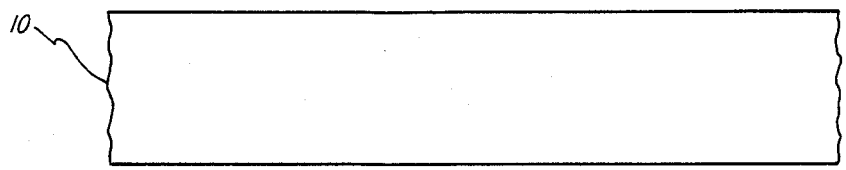
FIGS. 1 through 10 are enlarged cross-sectional views illustrating a sequence of steps in the fabrication of a typical dielectrically isolated semiconductor structure.
Figure 2:
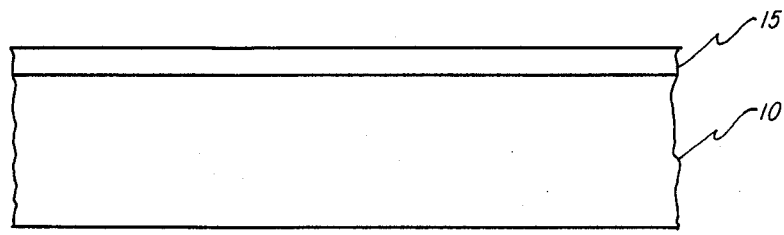
Figure 3:
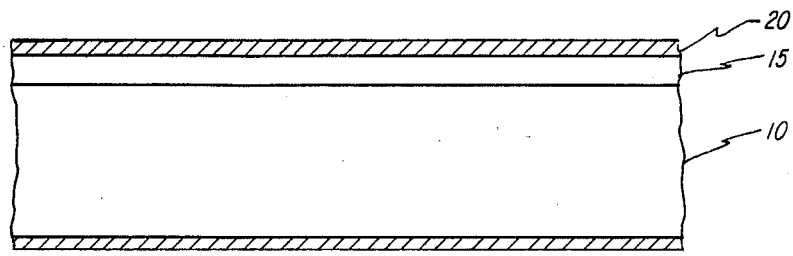
Figure 4:
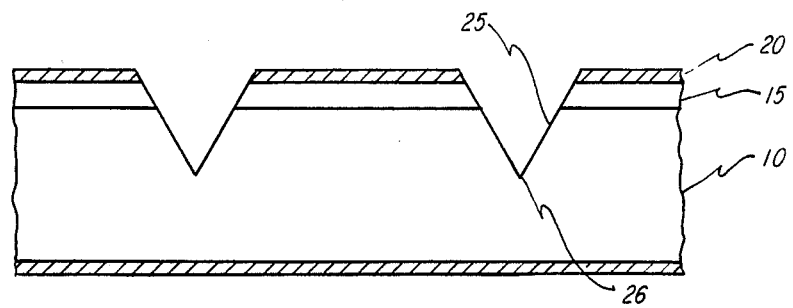
Figure 5:
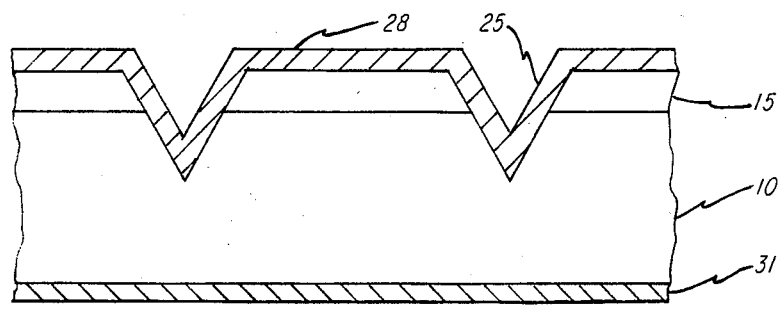
Figure 6:
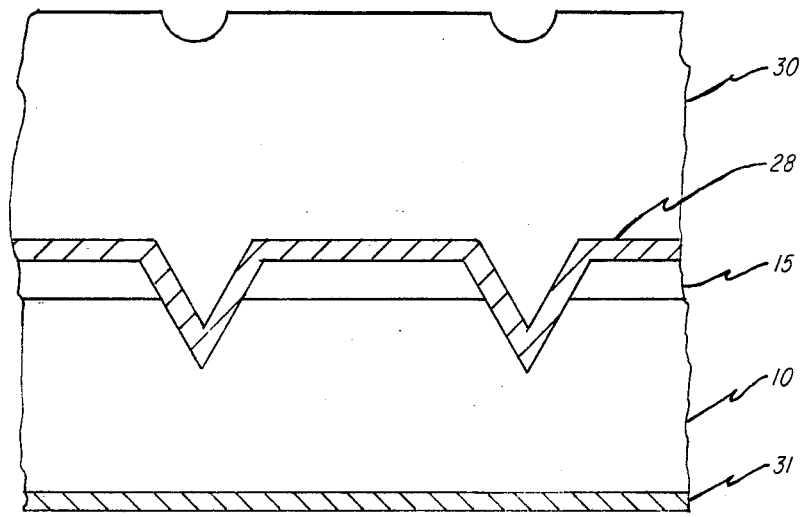
Figure 7:
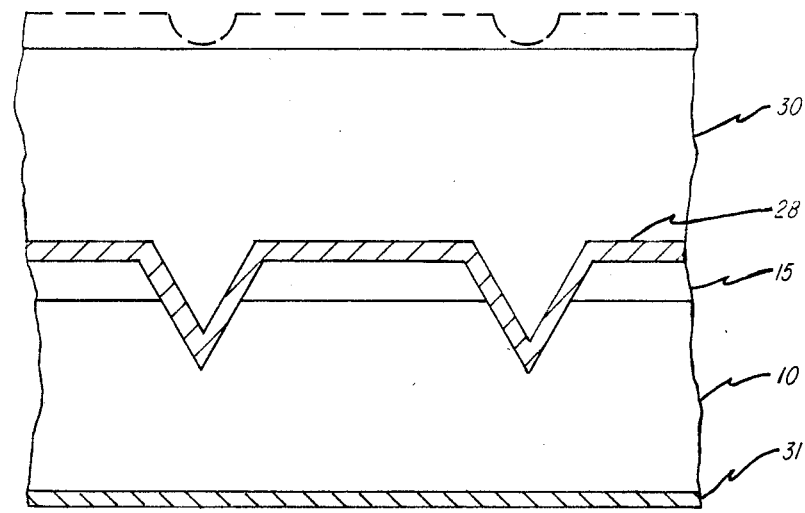
Figure 8:
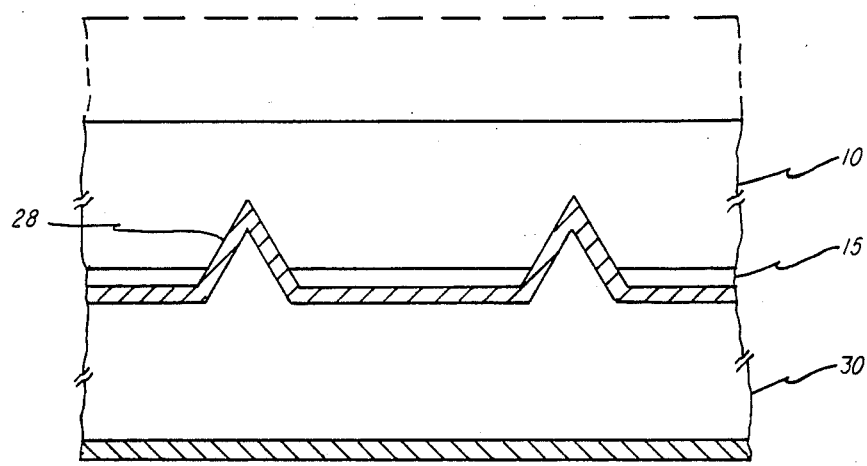
Figure 9:
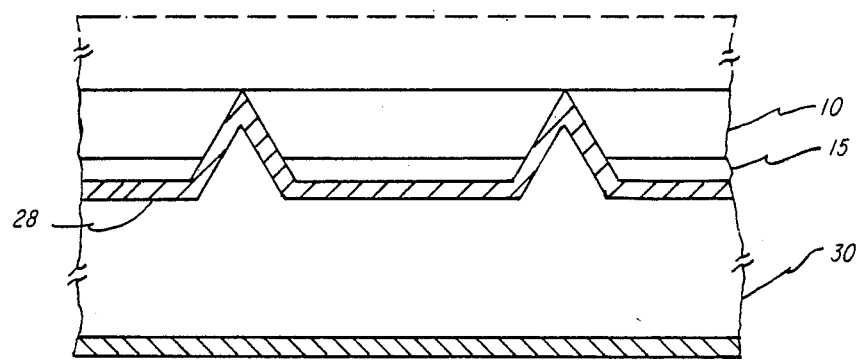
Figure 10:
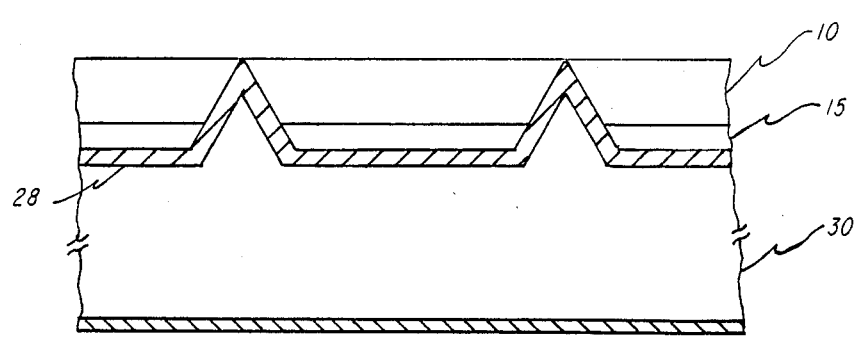
Figure 11:
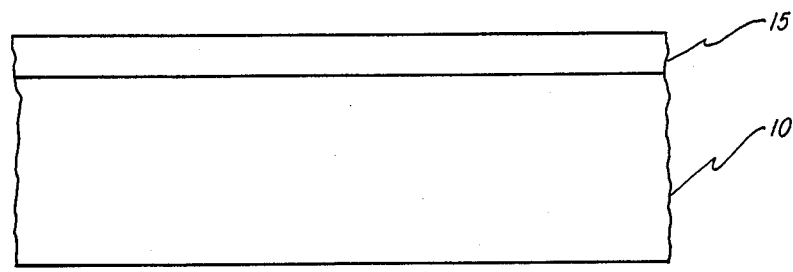
FIGS. 11 through 20 are enlarged cross-sectional views illustrating a sequence of steps in the fabrication of a semiconductor structure in accordance with a preferred embodiment of the invention.

FIGS. 1 through 10 are enlarged cross-sectional views illustrating a sequence of steps used in the fabrication of a prior art dielectric isolated structure. Specifically in FIG. 1, a substrate 10 is provided formed of a low resistivity monocrystalline silicon wafer of N-type conductivity. A layer 15 of heavily doped N-type silicon is provided on the top surface of the substrate 10, which will serve as a buried layer in the final product. The N-type layer 15 is then oxidized 20 and patterned for the isolation pattern. Moats or grooves 25 are formed in the surface, as shown in FIG. 4. The moats 25 are then oxidized to provide the oxide layer 28. A thick polycrystalline silicon layer 30 is grown on the surface of oxide layer 28. The top surface of the polycrystalline layer 30 is then ground to be parallel with the bottom surface 31 of the substrate 10. The substrate 10 is then ground close to the moat area, as shown in FIG. 9.

Figure 12:
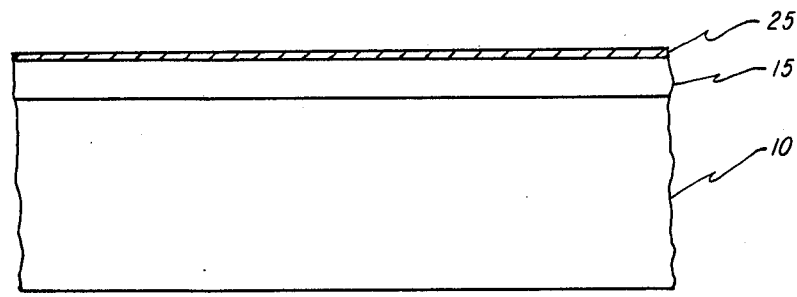

FIGS. 11 through 20 illustrate the dielectric isolation process using double wafer bonding in accordance with the preferred embodiment of the present invention. In this preferred embodiment, a substrate 10 is provided formed of a low resistivity monocrystalline silicon wafer of an N type conductivity. An epitaxial layer 15 of monocrystalline silicon is grown using known methods and is usually N type doped with arsenic or phosphorous, although in special applications, it can be made P type doped with boron. The resistivity chosen for the epitaxial layer 15 is dependent on the final circuit appliciation. In a preferred practice, however, the resistivity should be at least in order of magnitude higher than the substrate 10. Normal resistivity of an N+ substrate is less than 0.02 ohm-cm, but the process should work for a resistivity up to approximately 0.05 ohm-cm. Also in a preferred practice, the epitaxial layer deposition temperature should be as low as practical to limit diffusion and autodoping from the substrate. A temperature of approximately 1080° C. to 1100° C. is an appropriate temperature to allow good crystal quality growth while maintaining diffusion and autodoping under control. The epitaxial layer thickness also depends upon the current application of the semiconductor device, recognizing, however, that the layer will be thinned by subsequent oxidations, as well as by the later removal of the diffused interface caused by the higher dopant level of the substrate. The surface of the epitaxial layer is oxidized 25, as illustrated in FIG. 12, to an optimum level to promote the oxide-to-oxide bond made later in this process. Typically this oxide layer 25 will be approximately 500 Angstroms thick. It is noted that the native oxide which will grow on the exposed surface of the epitaxial layer may be sufficient to promote the oxide bonding, and thus a separate oxidation step for the epitaxial layer is not absolutely necessary.

Figure 13:
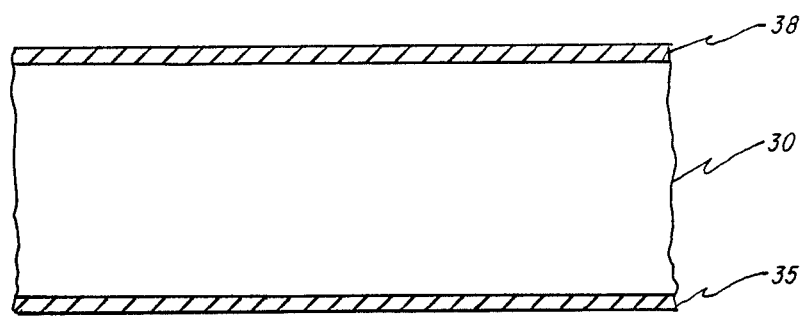

In FIG. 13, a wafer 30 is illustrated, commonly referred to as handle wafer. This first handle wafer 30 should have a flat, polished surface such as less than 4 micron TIR. This handle wafer 30 should also have a thickness variation of less than 5 microns and having a typical thickness of approximately 500 to 600 microns. An oxide layer 35 is grown or deposited on this polished surface by any suitable technique, i.e. thermal oxidation in a temperature range of 850° C. to 1250° C. This oxide layer will typically be between 1 to 3 microns thick. During this step, a second oxide layer 38 may also be formed on the backside of the handle wafer 30. This latter oxide layer 38 will protect the handle wafer during the subsequent removal of the substrate 10.

Figure 14:
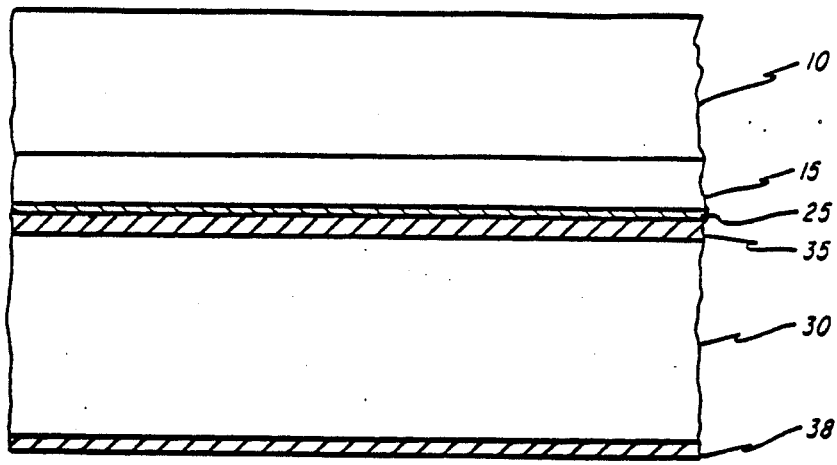

The bonding of the substrate wafer 10 and the handle wafer 30 is shown in FIG. 14. The oxide layer 25 formed on the epitaxial layer 15 is placed into contact with the oxide layer 35 on the handle wafer 30. The two wafers are then placed in a furnace at approximately 1100° C. for approximately one hour or more. The furnace may include an oxidizing ambient such as steam or wet oxygen to help facilitate the bonding process. The bnoding occurs, reportedly, due to the fusing of the hydroxyl groups in the two oxidized surfaces.

Alternatively, the two wafers may be bonded by placing them in a rapid thermal annealer (RTA) which is capable of heating the wafers up to 1200° C. in 30 seconds or less. After the wafers are placed in the RTA, they are rapidly heated to a temperature between approximately 800° C. and approximately 1200° C. for approximately 3 to 10 minutes. Prior to the heating of the wafers, the RTA is purged of contaminants by a gas such as oxygen during this process.

Figure 15:
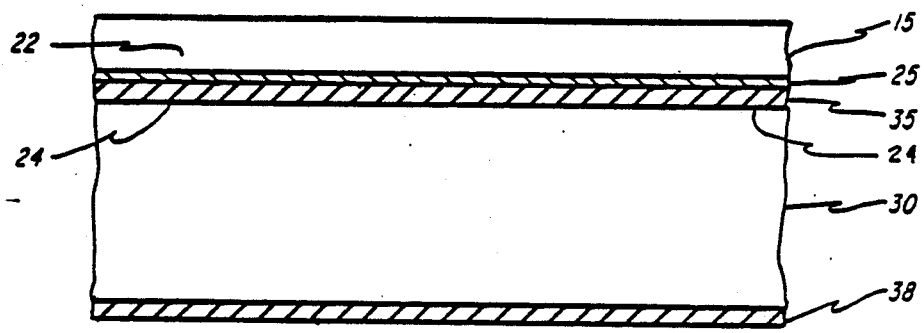

Referring to FIG. 15, the original wafer substrate 10 is now grounded and etched away in a fashion similar to that described in a commonly assigned U.S. Pat. No. 4,554,059 to Short, et al., entitled "Electrochemical Dielectric Isolation Technique" and which disclosure is herein incorporated by reference. Briefly, this etching process includes thinning the substrate by grinding or etching to usually between 1 to 2 mils thick. The remainder is electrochemically etched to near the original interface between the heavily doped substrate and the lightly doped epitaxial layer. This is generally done in a dilute hydroflouric (HF) bath with electric current flowing through the conductive substrate layer 10. The thin layer remaining from the surface is then chemically polished away to remove any reaction products due to the electrochemical process in addition to removing any heavier doped region due to diffusion or autodoping. It is significant to keep the time-temperature conditions of the epitaxial layer 15 and substrate 10 interface as low as possible in order to minimize the amount that has to be removed. As illustrated in FIG. 15, the epitaxial layer 15 is on the surface 22 of the combined oxide layers 25 and 35 which in turn are on a surface 24 of the handle wafer 30.

Figure 16:
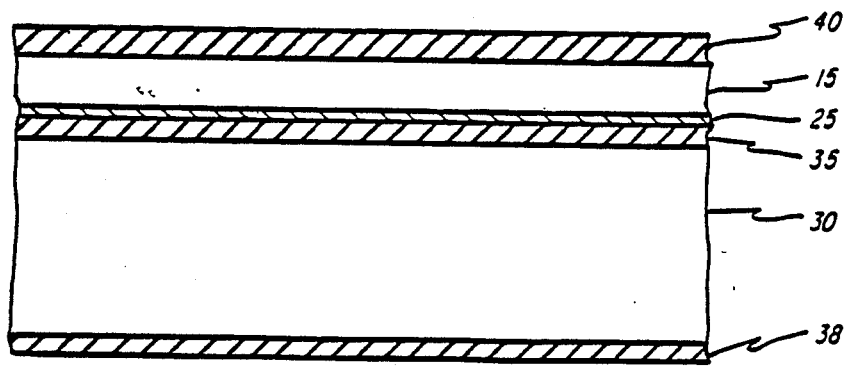

If the final semiconductor product requires a highly conductive buried layer such as for bipolar applications, a heavy concentration of dopant atoms 40 is deposited on the surface of the epitaxial layer 15 at this time as illustrated in FIG. 16. This dopant layer 40 is then diffused into the epitaxial layer 15 to a depth and gradient level dictated by the specific device or circuit requirements. For purposes of this application, the following discussion will assume that such a buried layer 40 is preferred.

Figure 17:
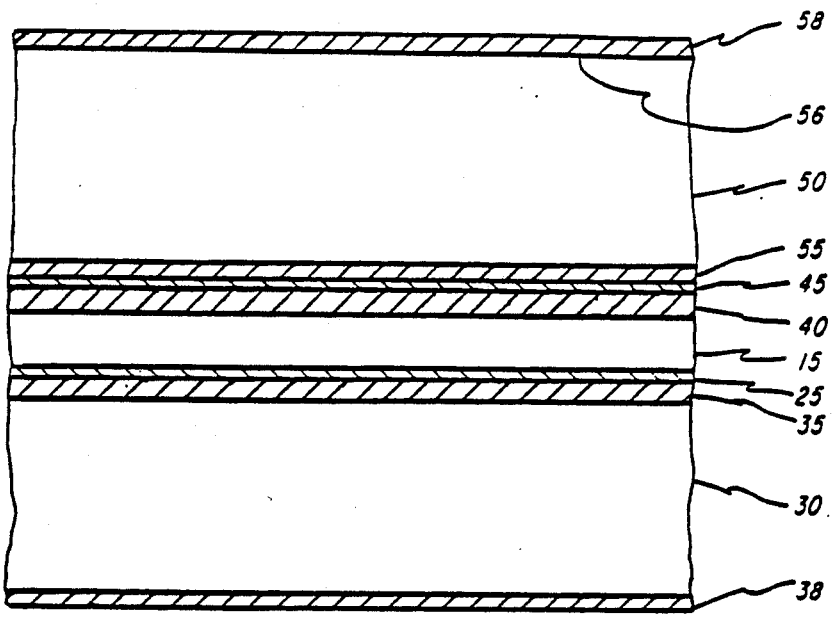

As shown in FIG. 17, a second handle wafer 50 is provided. Similar to the bonding of the previous handle wafer 30, an oxide layer 55 is provided on the surface to be bonded using any suitable technique, such as thermal oxidation in a temperature range of 850° C. to 1250° C. This oxide layer 55 will serve as the dielectric layer in the final DI/SOI structure. In the preferred process, this dielectric layer 55 is approximately 1 to 4 microns thick.

Also similar to the previous bonding process of the first handle wafer 30, the conductive buried layer 40 provided on the substrate 10 is placed into contact with the oxide layer 55 on the second handle wafer 50. An additional oxide layer 45 of approximately 500 Angstroms or less thick may be provided on the conductive buried layer 40 prior to placing the respective layers into contact. The two wafers are then placed either in a furnace at approximately 1100° C. for approximately one hour or more or alternatively in a rapid thermal annealer at approximately the same temperature for approximately 3 to 10 minutes.

A layer of dielectric material 58 such as an oxide is provided on the exposed back-surface 56 of the second handle wafer 50. This layer can be formed during the bonding process or during the oxidation of the buried layer 40 and provides protection of the second handle wafer 50 during the subsequent removal of the first handle wafer 30.

The oxide layer 38 on handle wafer 30 is now stripped from the handle wafer 30, while the dielectric layer 58 protects the second handle wafer 50. The first handle wafer 30 is then ground and etched away to the combined oxide layers 25 and 35. In the preferred process, the etch process is finished with potassium hydroxide (KOH) because of the minimal damage it will have on the oxide layers.

Figure 18:
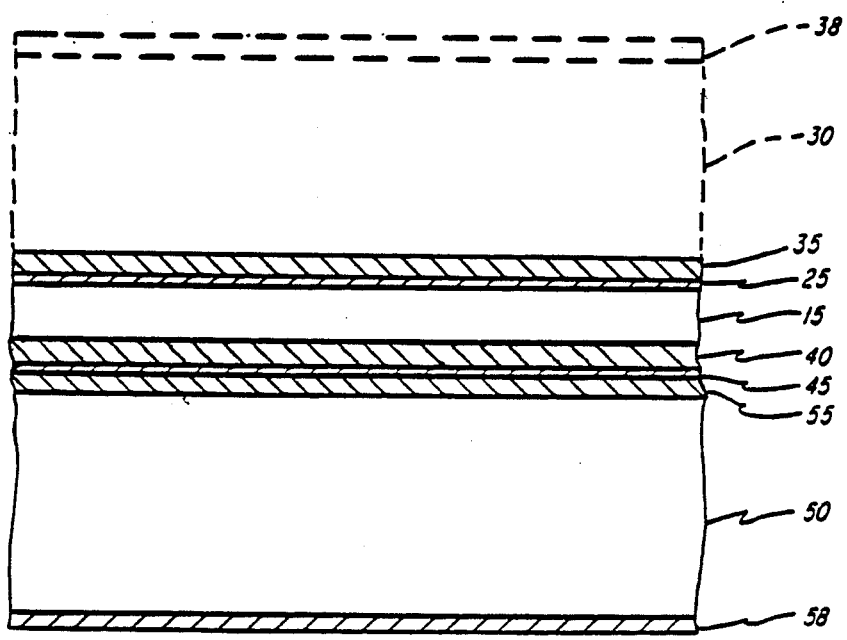

As illustrated in FIG. 18, a high crystal quality single crystal layer is provided on an oxide 45, 55 which in turn is provided on a single crystal bond wafer 50. For product structures requiring sidewall isolation, a pattern is now photomasked and etched in the surface oxide 25, 35 corresponding to the eventual isolation matrix. If the conductive heavily doped buried layer 40 was previously diffused selectively, infrared alignment can be used for aligning the mask with the selective areas of the buried layer 40.

Figure 19:
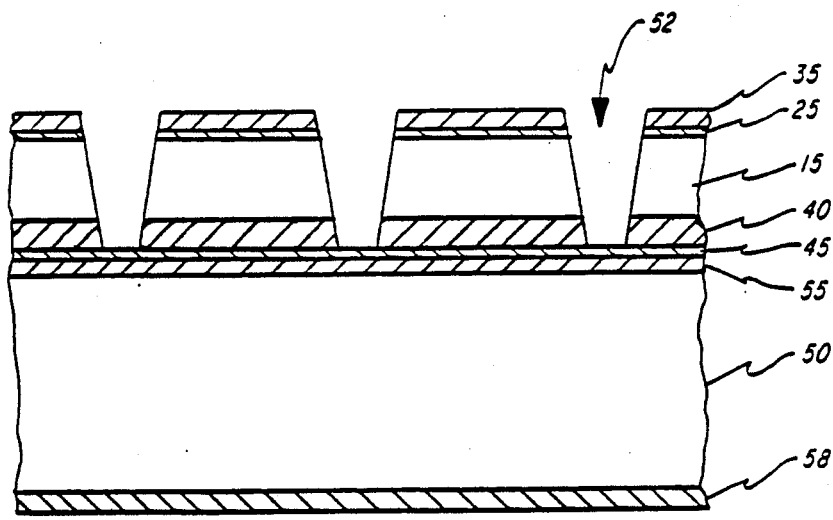

As illustrated in FIG. 19, moats or grooves 52 are anisotropically etched through the isolation pattern, into the surface, stopping at the combined buried oxide layers 45 and 55. This process of forming the moats is referred to as "patterning". In a preferred process, this moat etch is done with reactive ion etching (RIE) resulting in a steeper etch angle than made possible with the more standard anisotropic etches using the water-potassium hydroxide-alcohol system. Additionally, the RIE system reproduces the geometry of the mask without requiring corner compensation, thereby resulting in improved alignment control for producing smaller island size. The standard potassium hydroxide etch system, with its approximately 55° angle between the (100) and (111) planes can be used, although it will be at the expense of eventual design circuit size. Both of these etching processes, nonetheless, have virtually no undercutting relative to the oxide pattern.

Additionally, though the reactive ion etch angle can be virtually perpendicular to the (100) surface, it is best to have a slight taper due to the need to fill the resulting grooves without voids. The taper angle preferred is between approximately 5° and approximately 10° from the perpendicular.

The combined oxide layers 25 and 35 are now stripped off the epitaxial layer 15 so that a new dielectric oxide layer 60 may be grown on the resulting surface forming the dielectric isolating walls. The thickness of this subsequent dielectric oxide layer 60 depends on the final circuit application, but is usually in the 1 to 2 micron range. All or part of this oxide may be pyrolytic to enhance the thickness control of the final thin islands.

Figure 20:
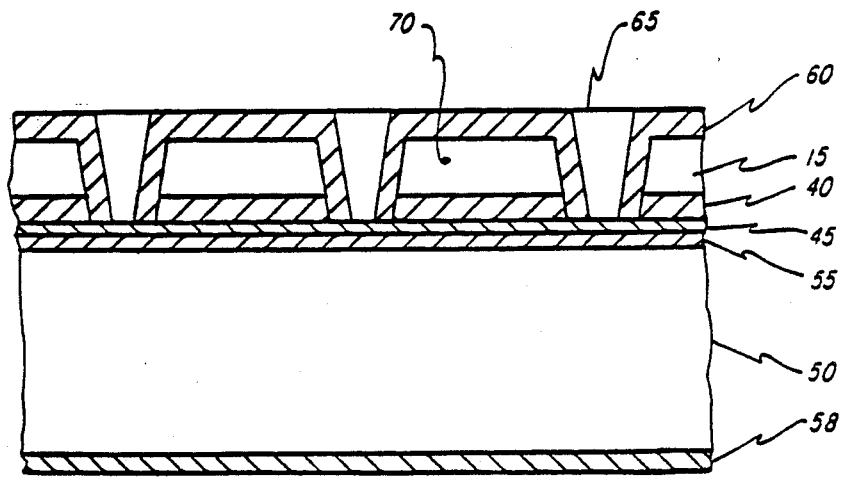

After providing the new dielectric oxide layer 60, a thin layer of polycrystalline silicon 65 is grown, completely filling the moats to at least a micron above the oxidized surface plane. The polycrystalline silicon layer 65 can be grown with the combination of conventional hotwall (CVD) techniques or epitaxial reactor techniques, depending upon the depth of the moats. The polycrystalline layer 65 is then polished to the oxide stop 60 surface using a predominantly chemical polish such as a high pH silica gel. This results in a planar surface as shown in FIG. 20 with the surface oxide 60 intact. This oxide can be used for further device masking such as for oxidizing the polycrystalline silicon layer 65. Other planar removal techniques, involving plasma etching, can be used instead of the polishing step.

The finished structure shown in FIG. 20 has a typical dielectric isolation (DI) structure with single crystal silicon islands 70, surrounded by a sidewall oxide 60 and bottom oxide 45, 55, separated by polycrystalline silicon 65 formed into the surface. A conductive buried layer 40 is at the bottom of the islands 70 if desired for bipolar applications. The islands are supported by a second handle 50.

The island surface itself has been protected by at least one oxide layer since the epitaxial surface 15 was first bonded to the first handle wafer 30. As a result, the silicon surface is not ground or polished as in the previously known procedures, thereby preventing damage otherwise resulting from these mechanical steps. Additionally, the invention allows for the single crystal islands to have virtually any required thickness, from less than 2 microns to 50 microns or more, making the process useful for a wide range of bipolar or MOS applications. The thickness variation of each island can be in the plus or minus 0.5 micron range or less. Also as a result of the present invention, the spacing between the islands can be less than conventional prior dielectrically isolated structures due to the steep angle by which the RIE modes can develop. Additionally, due to the absence of a thick polycrystalline layer as used in the previous DI processes, there is little differential stress during the heating steps, resulting in minimal bulk crystal defects and pattern run-in distortion. Also, as no corner compensation is necessary, smaller size islands can be made, further aiding circuit density.

It is noted that the following appended claims refer to a first surface of the device forming layer provided on it a layer which is subsequently removed, resulting in exposing the device forming layer surface. Although the claims refer to this exposed surface as said first surface of the device forming layer, it is recognized that the original first surface prior to the application of the layer may have been slightly modified as a result of the removal of this layer, and thus the first surface after the removal of the layer may not be exactly the same first surface prior to the application of that layer.

Although the present invention has been described and illustrated in detail, it is to be clearly understood that the same is by way of illustration and example only, and is not to be taken by way of limitation. The spirit and scope of the present invention are to be limited only by the terms of the appended claims.

What is claimed is:

1. A method of producing a semiconductor structure comprising:

(a) providing a device forming layer on a first semiconductor substrate, said device forming layer having an exposed first surface;
(b) bonding a first surface of a first handle wafer to said first surface of said device forming layer;
(c) removing said semiconductor substrate from said device forming layer and exposing a second surface of said device forming layer;
(d) bonding a first surface of a second handle wafer to said exposed second surface of said device forming layer;
(e) removing said first handle wafer from said first surface of said device forming layer; and
(f) patterning said first surface of said device forming layer and forming moats therein.

2. The method of claim 1, further comprising providing a first dielectric layer on said first surface of said first handle wafer before bonding with said first surface of said device forming layer, wherein said patterning of said first surface of said device forming layer includes patterning said first dielectric layer.

3. The method of claim 2, further comprising providing a second dielectric layer on said first surface of said device forming layer before bonding with said first dielectric layer, wherein said patterning of said first surface of said device forming layer and said first dielectric layer, includes patterning said second dielectric layer.

4. The method of claim 3, further comprising providing a third dielectric layer on said first surface of said second handle wafer before bonding with said second surface of said device forming layer.

5. The method of claim 4, further comprising providing a fourth dielectric layer on said second surface of said device forming layer before bonding with said third dielectric layer.

6. The method of claim 5, wherein said moats formed in said device forming regions include exposed surfaces of said device forming regions, said method further comprising providing a fifth dielectric layer on said exposed surface of said device forming region.

7. The method of claim 6, wherein said first and second dielectric layer remaining on said first surface of said device forming region after patterning said layers, is removed prior to providing said fifth dielectric layer on said exposed surface of said device forming region.

8. The method of claim 7, furhter comprising providing a polycrystalline material in said moats and planarizing said polycrystalline material such that a first surface of said fifth dielectric layer is coplanar with a first surface of said polycrystalline material.

9. The method of claim 8, wherein said semiconductor substrate includes silicon, said device forming layer includes an epitaxial layer formed on said silicon substrate, and said dielectric layers include silicon dioxide formed on said respective surfaces.

10. The method of claim 7, further comprising providing a conductive layer after removing said semiconductor substrate, said conductive layer forming a buried conductive layer in the resulting semiconductor structure.

11. The method of claim 10, wherein said buried conductive layer is formed by implanting dopants onto said first surface of said device forming layer and diffusing said dopants into said device forming layer to a predetermined depth.

12. The method of claim 11, wherein said forming said moats includes anisotropically etching selected areas of said first and second dielectric layers and said device forming layer, wherein said etching stops at said third and fourth dielectric layer.

13. The method of claim 7, wherein said bonding of said first handle wafer and said device forming layer includes bringing said first and second dielectric layers into contact in a rapid thermal annealer, and heating said exposed surfaces to a temperature between approximately 800° C. and 1200° C. for approximately three to ten minutes and wherein said bonding of said second handle wafer and said device forming layer includes bringing said third and fourth dielectric layers into contact in said rapid thermal annealer and heating said exposed surfaces to a temperature between approximately 800° C. and 1200° C. for approximately three to ten minutes.

14. The method of claim 7, wherein said bonding of said first handle wafer and said device forming layer includes bringing said first and second dielectric layers into contact in a furnace, and heating said exposed surfaces to a temperature between approximately 800° C. and 1200° C. for approximately two to three hours and wherein said bonding of said second handle wafer and said device forming layer includes bringing said third and fourth dielectric layers into contact in said furnace and heating said exposed surfaces to a temperature between approximately 800° C. and 1200° C. for approximately two to three hours.

15. A method of producing a dielectrically isolated silicon on insulator semiconductor structure comprising:
 (a) growing an epitaxial semiconductor layer on a monocrystalline semiconductor substrate;
 (b) providing a first oxide layer on a top surface of said epitaxial layer, said first oxide layer having a top surface;
 (c) bonding a first handle wafer to said top surface of said first oxide layer;
 (d) removing said substrate from said epitaxial layer and exposing a surface of said epitaxial layer;
 (e) providing a second oxide layer on a said exposed surface of said epitaxial layer;
 (f) bonding a second handle wafer to an exposed surface of said second oxide layer;
 (g) removing said first handle wafer from said first oxide layer and exposing a top surface of said first oxide layer;
 (h) etching said first oxide laeyr and epitaxial layer to form moats extending from said top surface of said first oxide layer and terminating at said second oxide layer;
 (i) providing a third oxide layer on exposed surfaces of said epitaxial layer; and
 (j) selectively providing an insulating layer in said moats.

16. The method of claim 15, wherein said bonding of the respective first and second handle wafers includes arranging said handle wafers in contact with the respective first and second oxide layers, and placing the combination in a furnace having an oxidizing ambient and at a temperature of approximately 1100° C. for at least an hour.

17. The method of claim 16, wherein said bonding further includes providing an oxide layer on the respective handle wafers prior to bonding and bringing said oxide layers of said handle wafers into contact with the respective first and second oxide layers.

18. The method of claim 15, wherein said bonding of the respective first and second handle wafers includes arranging said handle wafers in contact with the respective first and second oxide layers, and placing the combination in a rapid thermal annealer for approximately three to ten minustes at a temperature of approximately 1100° C.

19. The method of claim 15, wherein providing said first and second oxide layers includes thermally growing said oxide layers.

20. The method of claim 15, further comprising providing an intermediate conductive layer at the surface of said epitaxial layer exposed in step (d) by doping the epitaxial layer exposed surface before providing said second oxide layer.

21. The method of claim 20, wherein said substrate is formed of a low resistivity monocrystalline silicon wafer of N type conductivity, said epitaxial layer is formed of a monocrystalline silicon of N-type conductivity and having a resistivity of approximately an order of magnitude higher than said substrate, and said conductive layer is formed of a heavily doped N type conductivity, said intermediate conductive layer provides a buried conductive layer.

* * * * *